(12) United States Patent
Chu

(10) Patent No.: US 12,143,054 B2
(45) Date of Patent: Nov. 12, 2024

(54) MOTOR UNIT

(71) Applicant: Global Mixed-mode Technology Inc., Hsin-Chu (TW)

(72) Inventor: Chien-Lun Chu, Hsinchu County (TW)

(73) Assignee: Global Mixed-mode Technology Inc., Hsin-Chu (TW)

( * ) Notice: Subject to any disclaimer, the term of this patent is extended or adjusted under 35 U.S.C. 154(b) by 459 days.

(21) Appl. No.: 17/525,929

(22) Filed: Nov. 14, 2021

(65) Prior Publication Data
US 2023/0155525 A1 May 18, 2023

(51) Int. Cl.
| | |
|---|---|
| H02P 6/28 | (2016.01) |
| H02K 11/33 | (2016.01) |
| H02P 6/06 | (2006.01) |
| H02P 6/26 | (2016.01) |
| H03M 1/12 | (2006.01) |

(52) U.S. Cl.
CPC ............... *H02P 6/26* (2016.02); *H02K 11/33* (2016.01); *H02P 6/06* (2013.01); *H02P 6/28* (2016.02); *H03M 1/12* (2013.01)

(58) Field of Classification Search
CPC ..... H02P 6/06; H02P 6/28; H02P 6/26; H02K 11/33; H03M 1/12
See application file for complete search history.

(56) References Cited

U.S. PATENT DOCUMENTS

| | | | | |
|---|---|---|---|---|
| 7,590,334 | B2 * | 9/2009 | Yabusaki | H02P 25/18 |
| | | | | 318/400.06 |
| 10,804,822 | B2 * | 10/2020 | Alcorn | H02P 6/24 |
| 10,910,967 | B2 * | 2/2021 | Miura | H02P 27/06 |
| 2002/0185926 | A1 | 12/2002 | King | |
| 2009/0039807 | A1 * | 2/2009 | Yabusaki | H02P 25/18 |
| | | | | 318/244 |
| 2023/0103263 | A1 * | 3/2023 | Zhang | H02M 1/15 |
| | | | | 323/282 |

FOREIGN PATENT DOCUMENTS

TW 200934096 8/2009

* cited by examiner

*Primary Examiner* — Thai T Dinh
(74) *Attorney, Agent, or Firm* — Winston Hsu

(57) ABSTRACT

A motor unit comprises a driving circuit, a control unit, an analog-to-digital converter, a voltage divider, and a voltage converter. The driving circuit is coupled to a motor for driving the motor. The control unit is configured to generate a plurality of control signals to control the driving circuit. The analog-to-digital converter receives an output voltage for generating a digital signal to the control unit. The voltage divider receives an input voltage for generating a first voltage. The voltage converter converts a power supply voltage into the input voltage. The motor unit may execute a prevention mechanism to avoid misjudging the digital signal. The motor unit may be applied to a high-voltage configuration.

50 Claims, 3 Drawing Sheets

MOTOR UNIT

BACKGROUND OF THE INVENTION

1. Field of the Invention

The present invention relates to a motor unit, and more particularly, to a motor unit which may be applied to a high-voltage configuration.

2. Description of the Prior Art

In general, the pin of the traditional integrated circuit may be set to be at the high/low level, such that the user is capable of selecting the needed function. However, by such setting method, the adjustable function and the resolution may be insufficient. In addition, the motor generates switching noise when operating in an operation mode. Such switching noise may affect accuracy of the adjustable function. When the motor controller is applied to a high-voltage configuration, the motor results in more noise. Thus, a new technology is needed to overcome the drawback of the prior art.

SUMMARY OF THE INVENTION

According to the present invention, a motor unit which may provide a better function and resolution for each parameter is provided. The motor unit comprises a motor controller and a voltage divider, where the voltage divider may be a resistive voltage divider. The motor controller may be implemented in an integrated circuit chip while the voltage divider may be implemented on a printed circuit board. The motor controller comprises a driving circuit, a control unit, an analog-to-digital converter, a switching circuit, a voltage converter, and a counting unit. The motor controller receives a power supply voltage, such that the driving circuit is biased at the power supply voltage. The voltage converter converts the power supply voltage into an input voltage, where the control unit, the analog-to-digital converter, the switching circuit, the counting unit, and the voltage divider are biased at the input voltage. The voltage converter may be a step-down converter, such that the power supply voltage is greater than the input voltage. For example, the power supply voltage may be equal to 12 volts while the input voltage may be equal to 5 volts. Therefore, both the motor unit and the motor controller may be applied to a high-voltage configuration. The driving circuit includes a first transistor, a second transistor, a third transistor, a fourth transistor, a first terminal, and a second terminal for driving a motor.

The voltage divider receives the input voltage, so as to generate a first voltage, a second voltage, and a third voltage. The voltage divider may comprise a first resistor, a second resistor, a third resistor, a fourth resistor, a fifth resistor, and a sixth resistor. The first resistor is coupled to the second resistor and receives the input voltage for generating the first voltage to the switching circuit. The third resistor is coupled to the fourth resistor and receives the input voltage for generating the second voltage to the switching circuit. The fifth resistor is coupled to the sixth resistor and receives the input voltage for generating the third voltage to the switching circuit. The voltage divider does not limit that three voltage division information can be provided. When the motor controller is implemented in the integrated circuit chip, the designer may provide one voltage division information or a plurality of voltage division information to the user for setting the needed parameter(s) based on the package type and the pin count. If the user just needs one voltage division information, the switching circuit may be ignored. That is to say, the voltage divider may generate the first voltage to the analog-to-digital converter.

The control unit may further generate a select signal to the switching circuit. The switching circuit may be configured to generate an output voltage to the analog-to-digital converter based on the first voltage, the second voltage, the third voltage, and the select signal. The select signal may be a 2-bit digital signal. For example, when the select signal is equal to 00, the switching circuit selects the first voltage to be the output voltage. When the select signal is equal to 01, the switching circuit selects the second voltage to be the output voltage. When the select signal is equal to 10, the switching circuit selects the third voltage to be the output voltage. The analog-to-digital converter receives the output voltage, so as to generate a digital signal to the control unit. At last, the control unit may set each parameter based on the digital signal. Therefore, both the motor unit and the motor controller may provide a better function and resolution for each parameter.

More specifically, when the motor is in an operation mode, the motor controller generates various noises due to the interference caused by the motor. Consequently, both the motor unit and the motor controller may execute a prevention mechanism to avoid misjudging the digital signal. When the voltage of the first terminal or the voltage of the second terminal changes, the waveform of the power supply voltage generates noises. Such noises will transfer to the voltage divider via the voltage converter, resulting that the analog-to-digital converter decodes erroneously. Thus, the control unit may further generate an enable signal to the analog-to-digital converter. The analog-to-digital converter may determine whether or not to stop decoding based on the high/low level of the enable signal. When the power supply voltage is less than a predetermined value, both the motor unit and the motor controller may enable the analog-to-digital converter to stop decoding. When the enable signal is at a high level, the control unit may enable the analog-to-digital converter to decode normally. When the enable signal is at a low level, the control unit may enable the analog-to-digital converter to stop decoding. Furthermore, both the motor unit and the motor controller may set a time interval, such that the analog-to-digital converter stops decoding within the time interval. The counting unit receives a clock signal for generating a time signal to the control unit. The time signal may be indicative of the time interval. For instance, when the voltage of the first terminal or the voltage of the second terminal changes, the counting unit may generate the time interval, thereby enabling the analog-to-digital converter to stop decoding within the time interval. When the motor generates noise, the counting unit may recount. That is to say, when the voltage of the first terminal or the voltage of the second terminal changes, the counting unit may recount. By means of such prevention mechanism, both the motor unit and the motor controller may prevent the analog-to-digital converter from decoding erroneously and increase decoding accuracy of the analog-to-digital converter.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The above-mentioned and other objects, features, and advantages of the present invention will become apparent with reference to the following descriptions and the accompanying drawing, wherein.

DETAILED DESCRIPTION

Figure 1:
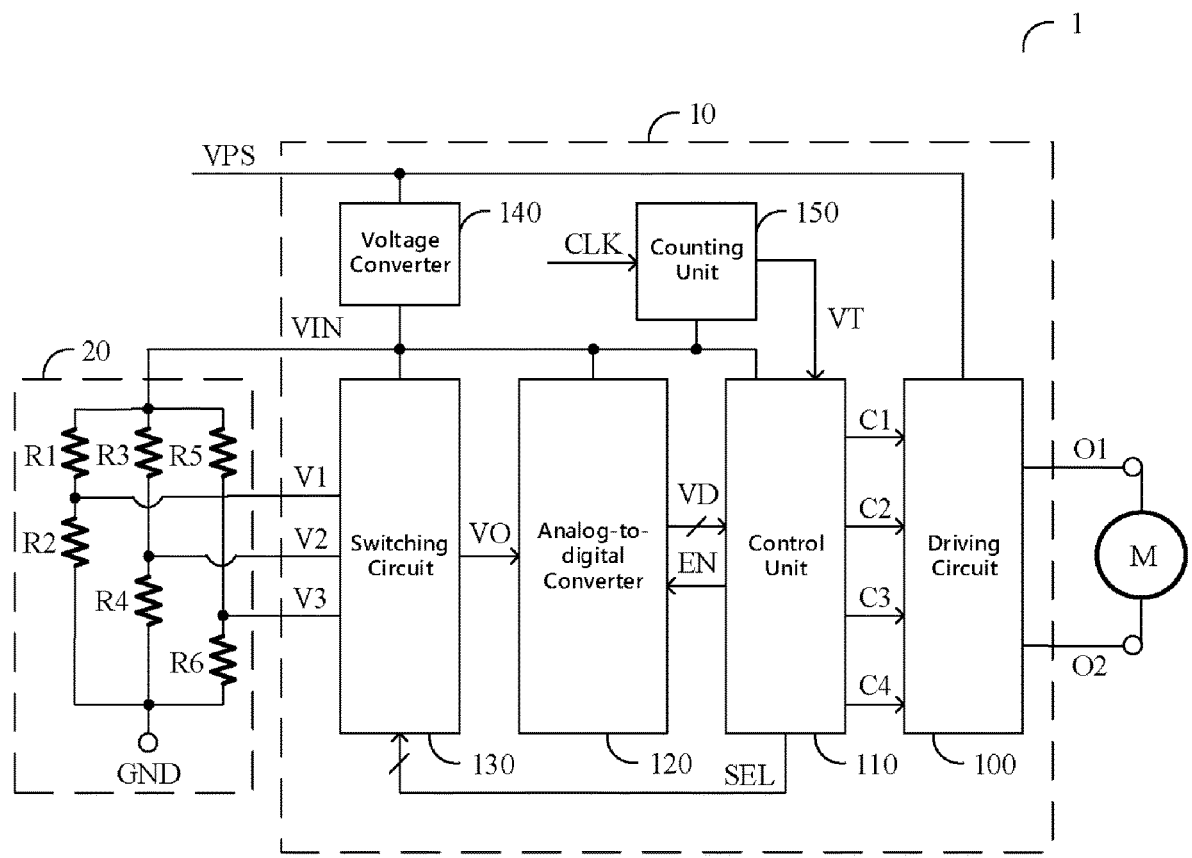
FIG. 1 is a schematic diagram showing a motor unit according to one embodiment of the present invention.

Preferred embodiments according to the present invention will be described in detail with reference to the drawing.

Figure 2:
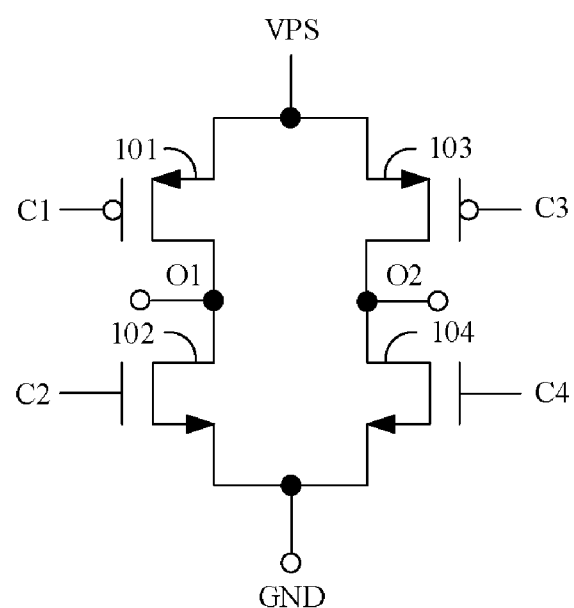
FIG. 2 is a schematic diagram showing a driving circuit according to one embodiment of the present invention.

FIG. 1 is a schematic diagram showing a motor unit 1 according to one embodiment of the present invention. The motor unit 1 comprises a motor controller 10 and a voltage divider 20, where the voltage divider 20 may be a resistive voltage divider. The motor controller 10 may be implemented in an integrated circuit chip while the voltage divider 20 may be implemented on a printed circuit board. The motor controller 10 comprises a driving circuit 100, a control unit 110, an analog-to-digital converter 120, a switching circuit 130, a voltage converter 140, and a counting unit 150. The motor controller 10 receives a power supply voltage VPS, such that the driving circuit 100 is biased at the power supply voltage VPS. The voltage converter 140 converts the power supply voltage VPS into an input voltage VIN, where the control unit 110, the analog-to-digital converter 120, the switching circuit 130, the counting unit 150, and the voltage divider 20 are biased at the input voltage VIN. That is to say, the motor controller 10 generated the input voltage VIN to the control unit 110, the analog-to-digital converter 120, the switching circuit 130, the counting unit 150, and the voltage divider 20. The voltage converter 140 may be a step-down converter, such that the power supply voltage VPS is greater than the input voltage VIN. For example, the power supply voltage VPS may be equal to 12 volts while the input voltage VIN may be equal to 5 volts. Therefore, both the motor unit 1 and the motor controller 10 may be applied to a high-voltage configuration. FIG. 2 is a schematic diagram showing the driving circuit 100 according to one embodiment of the present invention. Please refer to FIG. 1 and FIG. 2 simultaneously. The driving circuit 100 includes a first transistor 101, a second transistor 102, a third transistor 103, a fourth transistor 104, a first terminal O1, and a second terminal O2 for driving a motor M. The motor M is coupled to the first terminal O1 and the second terminal O2. The driving circuit 100 is configured to supply a coil current to the motor M. The first transistor 101 is coupled to the first terminal O1 and receives the power supply voltage VPS. The second transistor 102 is coupled to the first terminal O1 and a third terminal GND. The third transistor 103 is coupled to the second terminal O2 and receives the power supply voltage VPS. The fourth transistor 104 is coupled to the second terminal O2 and the third terminal GND. Each of the first transistor 101, the second transistor 102, the third transistor 103, and the fourth transistor 104 may be respectively a p-type MOSFET or an n-type MOSFET. As shown in FIG. 2, each of the first transistor 101 and the third transistor 103 may be a p-type MOSFET, while each of the second transistor 102 and the fourth transistor 104 may be an n-type MOSFET. The control unit 110 generates a first control signal C1, a second control signal C2, a third control signal C3, and a fourth control signal C4 so as to respectively control the ON/OFF states of the first transistor 101, the second transistor 102, the third transistor 103, and the fourth transistor 104.

The control unit 110 may operate alternatively in a first driving mode and a second driving mode, so as to supply the electric energy to the motor M. In the first driving mode, the control unit 110 turns on the first transistor 101 and the fourth transistor 104 by controlling the first control signal C1 and the fourth control signal C4. At this moment the current flows sequentially through the first transistor 101, the motor M, the fourth transistor 104, and the third terminal GND for supplying the electric energy to the motor M. In the second driving mode, the control unit 110 turns on the second transistor 102 and the third transistor 103 by controlling the second control signal C2 and the third control signal C3. At this moment the current flows sequentially through the third transistor 103, the motor M, the second transistor 102, and the third terminal GND for supplying the electric energy to the motor M. By operating alternatively between the first driving mode and the second driving mode, the motor M can be operated normally as a result.

By installing the voltage divider 20, the motor unit 1 may increase the function and the resolution of the pin. The voltage divider 20 receives the input voltage VIN, so as to generate a first voltage V1, a second voltage V2, and a third voltage V3. The voltage divider 20 may comprise a first resistor R1, a second resistor R2, a third resistor R3, a fourth resistor R4, a fifth resistor R5, and a sixth resistor R6. The first resistor R1 is coupled to the second resistor R2 and receives the input voltage VIN for generating the first voltage V1 to the switching circuit 130. The third resistor R3 is coupled to the fourth resistor R4 and receives the input voltage VIN for generating the second voltage V2 to the switching circuit 130. The fifth resistor R5 is coupled to the sixth resistor R6 and receives the input voltage VIN for generating the third voltage V3 to the switching circuit 130. For instance, the first voltage V1 may be used to set a minimum motor speed, an intermediate value of a motor speed, a minimum input duty cycle, a minimum output duty cycle, a maximum output duty cycle, an intermediate value of an output duty cycle, leading angle information, soft switching information, soft start information, or current limit information. Similarly, the second voltage V2 may be used to set a minimum motor speed, an intermediate value of a motor speed, a minimum input duty cycle, a minimum output duty cycle, a maximum output duty cycle, an intermediate value of an output duty cycle, leading angle information, soft switching information, soft start information, or current limit information. The third voltage V3 may be used to set a minimum motor speed, an intermediate value of a motor speed, a minimum input duty cycle, a minimum output duty cycle, a maximum output duty cycle, an intermediate value of an output duty cycle, leading angle information, soft switching information, soft start information, or current limit information. Thus, the voltage divider 20 of the present invention does not limit that three voltage division information can be provided. When the motor controller 10 is implemented in the integrated circuit chip, the designer may provide one voltage division information or a plurality of voltage division information to the user for setting the needed parameter(s) based on the package type and the pin count. If the user just needs one voltage division information, the switching circuit 130 of the present invention may be ignored. That is to say, the voltage divider 20 may generate the first voltage V1 to the analog-to-digital converter 120. Moreover, when the motor controller 10 is implemented in the integrated circuit chip, the first voltage V1 may correspond to a first voltage pin. The second voltage V2 may correspond to a second voltage pin. The third voltage V3 may correspond to a third voltage pin. The power supply voltage VPS may correspond to a power supply voltage pin. The input voltage VIN may correspond to an input voltage pin. The first terminal O1 may correspond to a first terminal pin. The second terminal O2 may correspond to a second terminal pin.

The control unit 110 may further generate a select signal SEL to the switching circuit 130. The switching circuit 130 may be configured to generate an output voltage VO to the analog-to-digital converter 120 based on the first voltage V1, the second voltage V2, the third voltage V3, and the select signal SEL. The select signal SEL may be a 2-bit digital signal. For example, when the select signal SEL is equal to 00, the switching circuit 130 selects the first voltage V1 to be the output voltage VO. When the select signal SEL is equal to 01, the switching circuit 130 selects the second voltage V2 to be the output voltage VO. When the select signal SEL is equal to 10, the switching circuit 130 selects the third voltage V3 to be the output voltage VO. The analog-to-digital converter 120 receives the output voltage VO, so as to generate a digital signal VD to the control unit 110. At last, the control unit 110 may set each parameter based on the digital signal VD. According to one preferred embodiment of the present invention, the analog-to-digital converter 120 may be an 8-bit analog-to-digital converter and the analog-to-digital converter 120 may be a SAR (Successive Approximation Register) analog-to-digital converter. Therefore, both the motor unit 1 and the motor controller 10 may provide a better function and resolution for each parameter.

Figure 3:
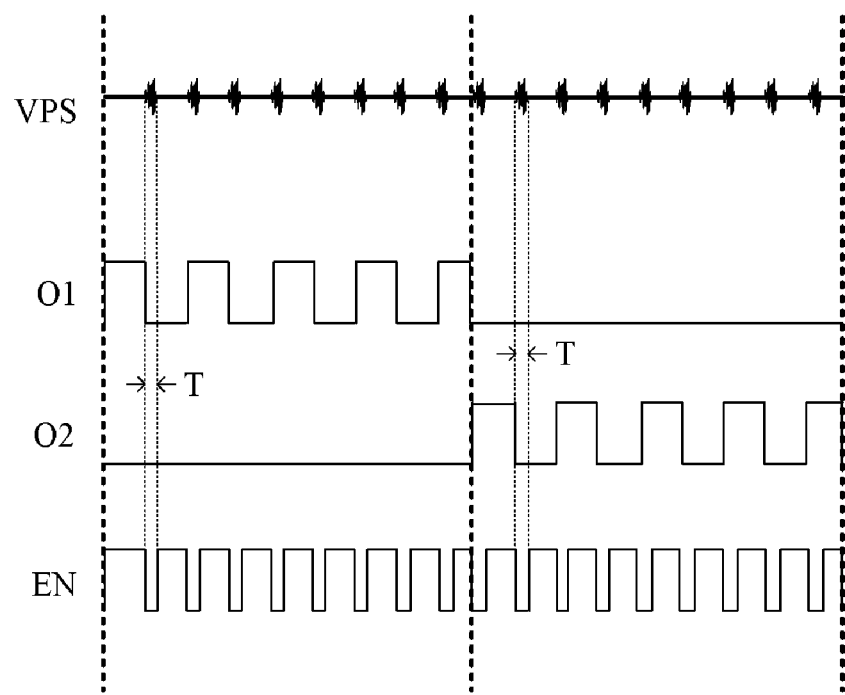
FIG. 3 is a timing chart according to one embodiment of the present invention.

More specifically, when the motor M is in an operation mode, the motor controller 10 generates various noises due to the interference caused by the motor M. Consequently, both the motor unit 1 and the motor controller 10 may execute a prevention mechanism to avoid misjudging the digital signal VD. FIG. 3 is a timing chart according to one embodiment of the present invention. When the voltage of the first terminal O1 or the voltage of the second terminal O2 changes, the waveform of the power supply voltage VPS generates noises. Such noises will transfer to the voltage divider 20 via the voltage converter 140, resulting that the analog-to-digital converter 120 decodes erroneously. Thus, the control unit 110 may further generate an enable signal EN to the analog-to-digital converter 120. The analog-to-digital converter 120 may determine whether or not to stop decoding based on the high/low level of the enable signal EN. When the power supply voltage VPS is less than a predetermined value, both the motor unit 1 and the motor controller 10 may enable the analog-to-digital converter 120 to stop decoding. When the enable signal EN is at a high level, the control unit 110 may enable the analog-to-digital converter 120 to decode normally. When the enable signal EN is at a low level, the control unit 110 may enable the analog-to-digital converter 120 to stop decoding. Furthermore, both the motor unit 1 and the motor controller 10 may set a time interval T, such that the analog-to-digital converter 120 stops decoding within the time interval T. The time interval T may be a predetermined value and the time interval T may be obtained by the experiment. According to one preferred embodiment of the present invention, the time interval T may be greater than 1 microsecond. The counting unit 150 receives a clock signal CLK for generating a time signal VT to the control unit 110. The time signal VT may be indicative of the time interval T. For instance, when the voltage of the first terminal O1 or the voltage of the second terminal O2 changes, the counting unit 150 may generate the time interval T, thereby enabling the analog-to-digital converter 120 to stop decoding within the time interval T. When the motor M generates noise, the counting unit 150 may recount. That is to say, when the voltage of the first terminal O1 or the voltage of the second terminal O2 changes, the counting unit 150 may recount. By means of such prevention mechanism, both the motor unit 1 and the motor controller 10 may prevent the analog-to-digital converter 120 from decoding erroneously and increase decoding accuracy of the analog-to-digital converter 120.

According to one embodiment of the present invention, both the motor unit 1 and the motor controller 10 may be applied to a single-phase motor system, a polyphase motor system, a sensorless motor system, a DC motor system, and a brushless motor system. Both the motor unit 1 and the motor controller 10 may provide a better function and resolution for each parameter. When the motor controller 10 is applied to a high-voltage configuration, the motor M results in more noise. Therefore, when the motor unit 1 and the motor controller 10 are applied to a high-voltage configuration, the motor unit 1 and the motor controller 10 may prevent the analog-to-digital converter 120 from decoding erroneously and increase decoding accuracy of the analog-to-digital converter 120 based on a prevention mechanism.

While the present invention has been described by the preferred embodiment, it is to be understood that the invention is not limited to the disclosed embodiment. On the contrary, it is intended to cover various modifications. Therefore, the scope of the appended claims should be accorded the broadest interpretation so as to encompass all such modifications.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A motor controller comprising:
   a driving circuit, coupled to a motor for driving the motor;
   a control unit, configured to generate a plurality of control signals to control the driving circuit;
   an analog-to-digital converter, configured to receive an output voltage for generating a digital signal to the control unit;
   a switching circuit, configured to generate the output voltage; and
   a counting unit, configured to receive a clock signal for generating a time signal to the control unit, wherein the motor controller generates an input voltage to a voltage divider, and the voltage divider is configured to generate a first voltage to the switching circuit.

2. The motor controller of claim 1, wherein the voltage divider comprises:
   a first resistor; and
   a second resistor, wherein the first resistor is coupled to the second resistor and receives the input voltage for generating the first voltage.

3. The motor controller of claim 2, wherein the voltage divider further comprises:
   a third resistor; and
   a fourth resistor, wherein the third resistor is coupled to the fourth resistor and receives the input voltage for generating a second voltage.

4. The motor controller of claim 3, wherein the control unit further generates a select signal to the switching circuit, and the switching circuit is configured to generate the output voltage based on the first voltage, the second voltage, and the select signal.

5. The motor controller of claim 1, wherein the analog-to-digital converter is a successive approximation register analog-to-digital converter.

6. The motor controller of claim 1, wherein the analog-to-digital converter is an 8-bit analog-to-digital converter.

7. The motor controller of claim 1, wherein the control unit further generates an enable signal to the analog-to-digital converter.

8. The motor controller of claim 7, wherein the analog-to-digital converter determines whether or not to stop decoding based on a high/low level of the enable signal.

9. The motor controller of claim 1, wherein the first voltage is used to set a minimum motor speed.

10. The motor controller of claim 1, wherein the first voltage is used to set an intermediate value of a motor speed.

11. The motor controller of claim 1, wherein the first voltage is used to set a minimum input duty cycle.

12. The motor controller of claim 1, wherein the first voltage is used to set a minimum output duty cycle.

13. The motor controller of claim 1, wherein the first voltage is used to set a maximum output duty cycle.

14. The motor controller of claim 1, wherein the first voltage is used to set an intermediate value of an output duty cycle.

15. The motor controller of claim 1, wherein the first voltage is used to set leading angle information.

16. The motor controller of claim 1, wherein the first voltage is used to set soft start information.

17. The motor controller of claim 1, wherein the first voltage is used to set current limit information.

18. The motor controller of claim 1, wherein the motor controller is configured to avoid misjudging the digital signal.

19. The motor controller of claim 1, wherein the motor controller is applied to a high-voltage configuration.

20. The motor controller of claim 1, wherein the motor controller is applied to a single-phase motor system or a polyphase motor system.

21. The motor controller of claim 1, wherein the motor controller sets a time interval, such that the analog-to-digital converter stops decoding within the time interval.

22. The motor controller of claim 21, wherein the time signal is indicative of the time interval.

23. The motor controller of claim 21, wherein the driving circuit comprises a first terminal and a second terminal, and when a voltage of the first terminal or a voltage of the second terminal changes, the counting unit generates the time interval.

24. The motor controller of claim 21, wherein the time interval is a predetermined value.

25. The motor controller of claim 21, wherein the time interval is greater than 1 microsecond.

26. The motor controller of claim 1, wherein when the motor generates noise, the counting unit recounts.

27. The motor controller of claim 1, wherein the driving circuit comprises a first terminal and a second terminal, and when a voltage of the first terminal or a voltage of the second terminal changes, the counting unit recounts.

28. The motor controller of claim 1, wherein the motor controller is implemented in an integrated circuit chip.

29. The motor controller of claim 1, wherein the voltage divider is implemented on a printed circuit board.

30. The motor controller of claim 1, wherein the first voltage corresponds to a first voltage pin.

31. The motor controller of claim 1, wherein when the motor controller is applied to a high-voltage configuration, the motor controller increases decoding accuracy of the analog-to-digital converter.

32. A motor unit comprising:
a driving circuit, coupled to a motor for driving the motor;
a control unit, configured to generate a plurality of control signals to control the driving circuit;
an analog-to-digital converter, configured to receive an output voltage for generating a digital signal to the control unit;
a voltage divider, configured to receive an input voltage for generating a first voltage;
a switching circuit, configured to receive the first voltage for generating the output voltage; and
a voltage converter, wherein the voltage converter converts a power supply voltage into the input voltage.

33. The motor unit of claim 32, wherein the control unit further generates a select signal to the switching circuit, and the switching circuit is configured to generate the output voltage based on the first voltage, a second voltage, and the select signal.

34. The motor unit of claim 33, wherein the switching circuit is biased at the input voltage.

35. The motor unit of claim 32, wherein the control unit is biased at the input voltage.

36. The motor unit of claim 32, wherein the analog-to-digital converter is biased at the input voltage.

37. The motor unit of claim 32, wherein the driving circuit is biased at the power supply voltage.

38. The motor unit of claim 32, wherein the voltage divider is implemented on a printed circuit board.

39. The motor unit of claim 32, wherein the voltage converter is a step-down converter, such that the power supply voltage is greater than the input voltage.

40. The motor unit of claim 32, wherein the motor unit further comprises a counting unit, and the counting unit receives a clock signal for generating a time signal to the control unit.

41. The motor unit of claim 32, wherein when the power supply voltage is less than a predetermined value, the motor unit enables the analog-to-digital converter to stop decoding.

42. The motor unit of claim 32, wherein the control unit further generates an enable signal to the analog-to-digital converter.

43. The motor unit of claim 32, wherein the motor unit is configured to avoid misjudging the digital signal.

44. The motor unit of claim 32, wherein the motor unit sets a time interval, such that the analog-to-digital converter stops decoding within the time interval.

45. The motor unit of claim 32, wherein the first voltage corresponds to a first voltage pin.

46. The motor unit of claim 32, wherein the power supply voltage corresponds to a power supply voltage pin.

47. The motor unit of claim 32, wherein the input voltage corresponds to an input voltage pin.

48. The motor unit of claim 32, wherein the motor unit is applied to a high-voltage configuration.

49. A motor unit comprising:
a driving circuit, coupled to a motor for driving the motor;
a control unit, configured to generate a plurality of control signals to control the driving circuit;
an analog-to-digital converter, configured to generate a digital signal to the control unit;
a voltage divider, configured to receive an input voltage for generating a first voltage to the analog-to-digital converter; and a voltage converter, wherein the voltage converter converts a power supply voltage into the input voltage.

50. The motor unit of claim 49, wherein the motor unit further comprises a counting unit, and the counting unit receives a clock signal for generating a time signal to the control unit.

* * * * *